:::
United States Patent [19]

Smeulers et al.

[11] 4,158,146
[45] Jun. 12, 1979

[54] DEVICE FOR COUPLING TRANSISTORS OPERATED IN I²L TO A TRANSISTOR OPERATED AT A HIGHER BIAS-CURRENT

[75] Inventors: Wouter Smeulers; Willem H. Amsen, both of Eindhoven, Netherlands

[73] Assignee: U.S. Philips Corporation, New York, N.Y.

[21] Appl. No.: 860,301

[22] Filed: Dec. 14, 1977

[30] Foreign Application Priority Data

Dec. 31, 1976 [NL] Netherlands .................. 7614610

[51] Int. Cl.² ................ H03K 19/08; H03K 19/20; H01L 27/00
[52] U.S. Cl. .................... 307/213; 307/270; 307/299 R; 307/305; 307/DIG. 1; 357/92
[58] Field of Search ........... 307/213, 214, 270, 299 R, 307/305, DIG. 1; 357/92

[56] References Cited

U.S. PATENT DOCUMENTS

| | | | |
|---|---|---|---|
| Re. 28,928 | 8/1976 | Hart | 357/92 X |
| 4,007,385 | 2/1977 | Chapron | 307/213 X |
| 4,009,397 | 2/1977 | Mulder et al. | 307/213 X |
| 4,053,923 | 10/1977 | Kang | 307/213 X |
| 4,056,810 | 11/1977 | Hart et al. | 357/92 X |
| 4,085,339 | 4/1978 | Goser et al. | 307/213 |

OTHER PUBLICATIONS

Kalter, "Bipolar and FET Integration on a Cammon Chip"; *IBM Tech. Discl. Bull.*, vol. 15, No. 12, pp. 3755–3756, 5/1973.
Hart et al., "Bipolar LSI Takes a New Direction with Integrated Injection Logic", *Electronics*, (Pub.), 10/3/74, pp. 111-118.
Berger et al., "Merged Transistor Logic with Power Driver", *IBM Tech. Discl. Bull.*, vol. 15, No. 5, pp. 1626-1627, 10/1972.
Lebesnerais et al., "MTL-to-TTL Interface Circuit", *IBM Tech. Discl. Bull.*, vol. 19, No. 12, pp. 4635, 5/77.

*Primary Examiner*—Larry N. Anagnos
*Attorney, Agent, or Firm*—Thomas A. Briody; Edward J. Connors, Jr.; James J. Cannon, Jr.

[57] ABSTRACT

A coupling device for adaptation of I²L transistors to a transistor operating with a higher bias current setting on a semiconductor body, said coupling device formed in one island from the combination of a current injector and a normally operated vertical transistor.

2 Claims, 4 Drawing Figures

DEVICE FOR COUPLING TRANSISTORS OPERATED IN I²L TO A TRANSISTOR OPERATED AT A HIGHER BIAS-CURRENT

BACKGROUND OF THE INVENTION

1. Field of the Invention

The invention relates to a device with a semiconductor body which contains a region comprising transistors operated in accordance with I²L technology, which transistors include a driver transistor which is coupled to a transistor operated at a higher bias current.

2. Description of the Prior Art

In the technical literature comprehensive articles on I²L (integrated injection logic) are found, the substance of this technology being that the current supply of the transistors of an integrated circuit is effected by a current injector which is disposed on the semiconductor body of the integrated circuit, which current injector with further zones of the semiconductor body constitutes a multilayer structure of at least three consecutive layers which are isolated from each other by rectifying junctions, the current which is injected into an intermediate layer by the current injector being collected by a collecting layer, which collecting layer also forms part of one or more transistors of the integrated circuit.

Although the name I²L might suggest that the invention is limited to use in logic circuits, this is in fact not so. Its the use in analog circuits should also be considered. Hereinafter I²L is to be understood to mean the variant described in the published Netherlands Patent Application No. 7,107,040, (U.S. patent application Ser. No. 876,219 now pending) in which the relevant transistors take the form of vertical inversely operated transistors.

SUMMARY OF THE INVENTION

The invention in particular relates to the problem of providing a coupling between such transistors operating in accordance with I²L technology, which are generally set to a very small bias current and low power, and additional transistors which should be capable of supplying far more power and which are consequently set to a higher bias current.

The invention is characterized in that for coupling the driver transistor to the transistor with a higher bias current setting, an island of one conductivity type is provided on the semiconductor body, which island is electrically isolated from the rest of the body and is connected to a fixed potential, and in which with the aid of zones of the other conductivity type a lateral transistor is formed, which transistor has the island and one of said zones in common with a vertical transistor, while said common zone is connected to said driver transistor, and within this zone a further (emitter) zone of the first conductivity type is formed, which is connected to the transistor with a higher bias current setting, the zone of the lateral transistor which is not common to the vertical transistor being connected to a supply point, in such a way that the current from said emitter zone is larger than the injector current with which the I²L transistors are operated.

The device in accordance with the invention result in an extremely compact structure which demands little space and is fully compatible with the fabrication technology for obtaining I²L transistors.

BRIEF DESCRIPTION OF THE DRAWINGS

The invention will now be described in more detail with reference to the drawing, in which

FIG. 1 is a plan view of a semiconductor body, of which the section shown in the left of the Figure comprises the transistors realized in accordance with I²L technology, of which the section shown in the right of the Figure comprises a transistor which is set to an increased bias current, while between the two parts the coupling section is shown schematically. This center section couples an output transistor of the left-hand section to the input of the transistor in the right-hand section. The three sections are represented as transistor structures realized in separate islands, but under certain circumstances it is possible to combine two islands into one island, for example if the transistor in the right-hand section is connected as an emitter follower.

As illustrated in FIG. 2, a semiconductor body of p-type silicon may be used in which the islands are formed with the aid of a deep p+ diffusion 2. In the body 1 buried zones 3 of the n+ conductivity type are formed, after which an epitaxial layer 4 of the n-conductivity type is grown. By means of the p+ doped isolation zone this layer 4 is divided into three parts, namely the zones 4a, 4b and 4c. With the aid of further photolithographic processes further p or n-doped zones 6, 8 and 7 respectively are formed in these three zones, whose shapes follow from FIGS. 1 and 2. Thus, transistor structures are obtained in known manner, which in a conventional manner can be connected by means of conductor tracks. These conductor tracks are schematically represented by means of the dashed lines in FIGS. 1 and 2. If desired the transistor structures within the zones 4a and 4b can be surrounded by a deep n+ doped zone 5, so to prevent the isolation zones 2 from collecting charges in an undesired manner.

Figure 1:
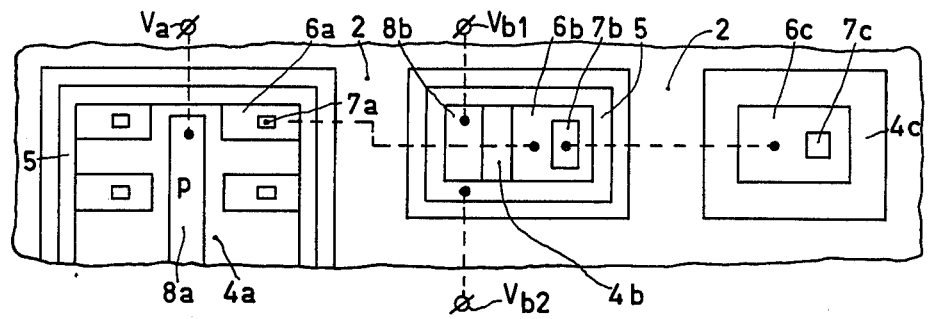
FIG. 1 is a plan view of a part of a semiconductor body for a device in accordance with the invention.

One of the transistor structures in the island of the zone 4a is formed by this zone 4a and the zones 6a and 7a. This transistor takes the form of an inverse vertical transistor, i.e. viewed at the top of the semiconductor body the following zones are situated underneath each other; first the collector zone 7a, then the base zone 6a, and then the emitter zone 4a. This transistor 4a, 6a and 7a, which is represented by the symbol a in the equivalent diagram of FIG. 3, receives its current from a so-called current injector. The p-zone 8a functions as an injector, which zone is laterally disposed relative to the zone 6a (and other transistor structures situated in the relevant zone 4a). The zone 4a is connected to a point of fixed potential, for example ground, while the zone 8a is connected to a point with a supply voltage $V_a$ of, for example, 1.5 V. As a result thereof charges from the zone 8a are injected into the zone 4a, which can reach the zone 6a (and also the other p-zones in the vicinity of the injector 8a), so that the zone 6a is forward-biased relative to the zone 4a. As a result of this the desired transistor action is obtained between the zones 4a (emitter, 6a (base) and 7a (collector).

The bias current of this I²L transistor is extremely small, which is generally considered a major advantage of the I²L technology, because this also minimizes the power consumption. However, the drawback is that the power which can be supplied to an external load by such a transistor is also extremely low. Therefore, it is desirable that transistors which operate with a higher bias current also be incorporated in the same semiconductor body.

Figure 2:
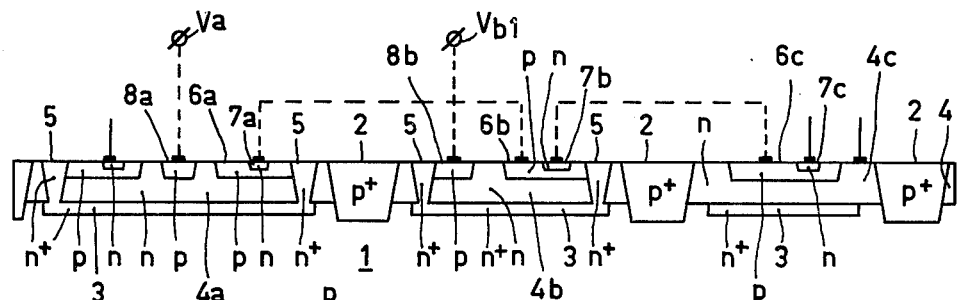
FIG. 2 is a cross-sectional view of the device of FIG. 1.
Figure 3:
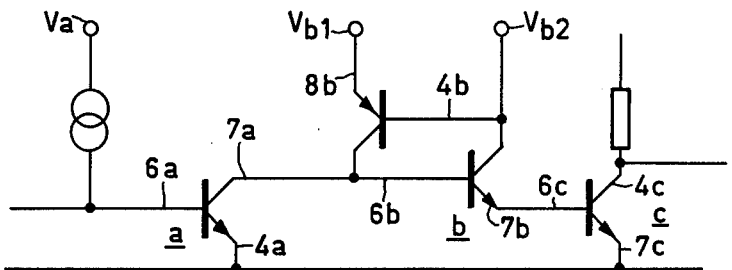
FIG. 3 shows the associated circuit diagram for the device of FIG. 1.

Such a transistor is realized in the zone 4c in FIGS. 1 and 2 and is represented by the symbol c- in FIG. 3. The three zones 4c, 6c and 7c again constitute a vertical transistor, but in normal operation instead of inverse operation such as the transistor a. The zone 7c functions as the emitter, the zone 6c as the base, and the zone 4c, whose area is much greater than that of the zone 7c, as the collector of the transistor. The collector-base current gain factor which can be achieved with such a transistor is several times greater than in the case of inverse operation.

In order to couple the output of the transistor a which functions as driver transistor, to the input of the transistor c, there is provided a coupling element in the form of the structure within zone 4b. This coupling element comprises a current injector 8b, which the injects current through zone 4b into zone 6b which is laterally situated relative to the injector 8b. Zone 6b constitutes the base zone of a normally operated vertical transistor, of which said zone 4b functions as the collector and zone 7b as the emitter. This transistor b consequently has a high current gain factor inherent in normal operation and is thus capable of matching the low current setting of I²L transistors to the higher current setting which is required for the transistor c. Zone 4b preferably is connected to a voltage $V_{b2}$ (for example 4 V) which is slightly higher than the voltage $V_a$ at the injector 8a. This voltage must be supplied by a source of such a low internal resistance, that the structure 8b, 4b, 6b, 7b which, as appears from the equivalent diagram of FIG. 3, has the character of a p-n-p-n structure does not become unstable. The voltage $V_{b1}$ at the zone 8b is normally applied through some resistance (in a similar way as the voltage $V_a$ at the zone 8a), because otherwise in the case of supply voltage and temperature variation excessive bias current variations might occur. Preferably, the injection currents of the injectors 8a and 8b are selected to be of the same magnitude.

Figure 4:
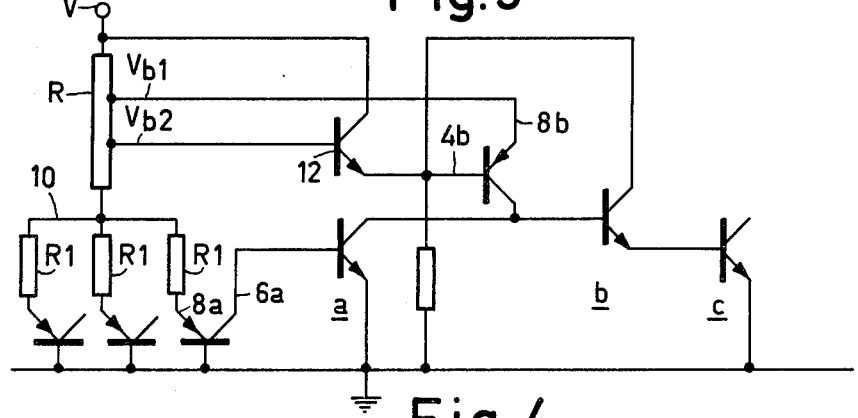
FIG. 4 is an extension of FIG. 3.

FIG. 4 schematically represents this current supply, while moreover attention has been paid to the use of more current injectors than described in the foregoing. A supply voltage point V, to which for example 12 V is applied, is then connected to a conductor 10 through a resistor R, which conductor through separate resistors $R_1$ leads to various current injectors (here represented by the symbol of a pnp-transistor), which injectors have the character as described hereinbefore with reference to the zones 8a, 4a, 6a. By means of tappings on the resistor R the voltages $V_{b1}$ and $V_{b2}$ are obtained, the voltage $V_{b1}$ again being applied to the zone 8b in a similar way, while the voltage $V_{b2}$ is applied to the zone 4b by an emitter follower 12. As appears from the diagram of FIG. 4, it is thus achieved in a simple manner that the internal resistance of the voltage source which is thus connected to the zone 4b, is comparatively low, while moreover the series resistance in series with the current injectors 8a and 8b remains sufficient to ensure undesired excess currents.

What is claimed is:

1. A coupling device within a semiconductor body having a region containing transistors operating in accordance with I²L technology including a driver transistor, said driver transistor being coupled to a transistor operated at a higher bias current, said coupling device comprising:

an island of a first conductivity type on said semiconductor body;

said island being electrically isolated from the rest of said semiconductor body;

said island being connected to a fixed potential;

said semiconductor body having a plurality of zones of a second conductivity type opposed to said first conductivity type;

a lateral transistor formed on said semiconductor body, its base being said island of said first conductivity type, its collector being a first zone of said second opposite conductivity type and its emitter being a second zone of said second opposite conductivity type;

a vertical transistor formed on said semiconductor body, said vertical transistor having said island and said first zone in common with said lateral transistor, said vertical transistor having said island as its collector; said first zone as its base and a third zone within said first zone of said first conductivity type as its emitter;

said first zone common to said lateral transistor and said vertical transistor being connected to said driver transistor;

said third zone, being the emitter of said vertical transistor and being connected to said transistor operated at a higher bias current;

said second zone of said lateral transistor, being its emitter, which zone is not common to said vertical transistor, and being connected to a voltage supply such that the current from said second zone is larger than the current with which said I²L transistors are operated.

2. The coupling device of claim 1 further comprising:

a supply point for a voltage source connected to at least one current injector of said I²L transistors through a resistor;

a tapping on said resistor being connected to said electrically isolated island through an emitter follower for supplyng said fixed potential.

* * * * *